Dec. 13, 1966 J. E. MANN ETAL 3,290,736

SEMICONDUCTOR ALLOYING TECHNIQUE

Filed March 4, 1964 2 Sheets-Sheet 1

NATHAN HIRSCH,
JOHN E. MANN,
HENRY TRIGGER,
INVENTORS.

BY THEIR ATTORNEYS.
Spensley & Horn.

SEMICONDUCTOR ALLOYING TECHNIQUE

NATHAN HIRSCH,
JOHN E. MANN,
HENRY TRIGGER,
INVENTORS.

BY THEIR ATTORNEYS
Spensley & Horn.

United States Patent Office 3,290,736

Patented Dec. 13, 1966

3,290,736

SEMICONDUCTOR ALLOYING TECHNIQUE

John E. Mann, Azusa, Henry Trigger, Monterey Park, and Nathan Hirsch, Los Angeles, Calif., assignors to TRW Semiconductors, Inc., Lawndale, Calif., a corporation of Delaware Filed Mar. 4, 1964, Ser. No. 349,304
2 Claims. (Cl. 22—58)

This invention pertains to the fabrication of semiconductor devices and more particularly to a method for alloying a metallic foil to a semiconductor body to create an ohmic contact thereto or a planar junction therein.

The term "semiconductor material," as utilized herein, is considered generic to material such as germanium, silicon, and germanium-silicon, silicon, alloys, as well as intermetallics such as indium-antimonide, gallium-arsenide, gallium-phosphorus alloys, indium-phosphorus alloys and the like, and is employed to distinguish these semiconductors from metallic oxide semiconductors, such as copper oxide.

In the semiconductor art, the term "active impurities" is used to denote those impurities which affect the electrical characteristics of the semiconductor material as distinguished from other impurities which have no appreciable effect upon these characteristics. A region of semiconductor material containing an excess of donor impurities and yielding an excess of free electrons is considered to be an N type impurity doped region. A P type doped region is one containing an excess of acceptor impurities resulting in a deficit of electrons, or stated differently, an excess of holes. In other words, an N type region is one characterized by electron conduction while a P type region is one characterized by hole conduction.

When a continuous, solid crystal specimen of semiconductor material has an N type region adjacent to a P type region, the boundary between them is termed a PN or an NP junction and the specimen of semiconductor material is termed an PN junction semiconductor device. These PN and NP junctions are referred to as "rectifying junctions." When donor impurity atoms are introduced into an N type semiconductor starting crystal of a given resistivity, an N type region of a different resistivity is produced. The gradation between these two regions of similar conductivity type but of differing resistivity is termed a "non-rectifying junction." Hence, the term "junction," as utilized herein, is intended to include both rectifying and non-rectifying junctions. A rectifying junction establishes a high resistance interfacial condition between two contacting semiconductor regions of opposite conductivity type, thereby resulting in a high impedance barrier which effectively electrically isolates one region from the other. A non-rectifying junction establishes an interfacial condition between two contacting semiconductor regions of the same conductivity type, the impedance of the interfacial barrier depending upon the relative resistivities of the two semiconductor regions. Non-rectifying junctions are typically used in the establishment of ohmic contacts by providing the semiconductor body with a surface region of the same conductivity type but of lower resistivity than that of the underlying semiconductor material, the relative resistivities of the two contacting semiconductor regions providing a fairly low impedance interfacial barrier so that the two regions are electrically interconnected.

Various methods have been evolved to create junctions in semiconductor materials, among them being the well known general method of heating a semiconductor wafer in contact with an active impurity. If the semiconductor wafer is heated to a temperature at which the impurity element becomes liquid or forms a liquid alloy with the semiconductor material, the technique is termed the "alloying" or "fusion" method. On the other hand, if the semiconductor wafer is heated in a vapor of an active impurity, such that there is no appreciable liquid formation, or, if the impurity remains solid or forms no liquid alloy, the technique is termed the "diffusion" method. The present invention technique is specifically directed to improvement of the "alloying" technique.

There are two general types of fusion techniques, and they are known in the art as the button fusion technique and the evaporative fusion technique. Semiconductor fusion techniques are based upon the creation, on the surface of a semiconductor body, of a molten layer containing atoms of an active impurity substance and atoms of the semiconductor material, crystal regrowth occurring upon cooling of the molten layer and the semiconductor body. In order to produce a uniform junction, the molten layer must be of constant thickness over the semiconductor surface, the amount of alloy on the semiconductor surface determining the junction characteristics. Hence, close control of the amount of molten alloy from which to regrow is necessary to produce a uniform junction of the desired characteristics.

Both of the aforementioned button fusion and evaporative fusion techniques are very difficult to control and it is practically impossible to obtain a uniform, planar junction by the exercise of these processes. The button fusion technique suffers from the additional disadvantage that the individual handling of each semiconductor device is necessary during the fusion process. In the evaporative technique, there is uncertain wetting and alloying, and the metal applied to the semiconductor surface is of uneven thickness. Hence, both the button fusion and evaporative fusion methods lack the characteristic of reproducibility, i.e., they cannot be relied upon to repeatedly produce substantially identical fused junctions under unvarying operating conditions. It is therefore readily apparent that neither of these methods are very well suited for use with mass production techniques.

Furthermore, a particularly useful mass production technique is to utilize a starting crystal of relatively broad area, the rectifying junction being formed in the starting crystal, and the crystal being subsequently diced into a large number of individual semiconductor devices. Hence, the formation of a broad area junction of uniform thickness and characteristics throughout its area is particularly desirable. Until recently, the evaporative technique was the only prior art method for achieving a broad area junction. However, the thickness of the evaporative layer is only on the order of microns. Also, due to the point source of the evaporative material, the deposited layer is of uneven thickness, the layer being thicker directly beneath the evaporative source and thinner in the areas spaced farther away from the evaporative source. Also, the quality of junction produced by the evaporative technique is not very high. Since the hot particles of active impurity substance are laying on a cold semiconductor surface, there is an inadequate resulting interface. Attempts to improve the quality of the junction produced by the evaporative technique have been generally unsuccessful. For example, an attempt was made to heat the semiconductor material to thereby cause formation of a eutectic after condensation of the active impurity particles upon its surface. However, the interface then was found to have dirt and other contaminates in certain spots, and to uneven wetting resulted. Hence, there exists a need for methods of producing a uniform planar broad area junction under reproducible and controllable conditions.

Realizing that close control of the amount of molten alloy from which regrowth occurs is necessary to enable the consistent reproduction of a uniform junction of desired characteristics, a so-called "foil fusion" method has been recently developed, this method being fully disclosed in copending U.S. Patent No. 3,188,252, entitled Method of Producing a Broad Area Fused Junction in a Semiconductor Body, issued June 8, 1965, and also assigned to the present assignee. This foil fusion technique is based upon control of thickness. A foil or sheet of active impurity metal is disposed against the surface of the semiconductor body to thereby form a semiconductor-foil sandwich. This sandwich is subjected to a compressive force during heating, a spacer plate being utilized to determine the minimum sandwich thickness. Thus, as the metallic foil dissolves the excess amount is squeezed out until the minimum sandwich thickness is achieved. Hence, a predetermined thickness of the molten layer is maintained during completion of the alloying to thereby result in a uniform, planar, broad area junction.

Unlike this foil fusion technique wherein the constant amount of solution from which to regrow is provided by establishing a minimum sandwich thickness, the present invention technique provides the constant amount of solution through the use of a fixed volume container, the presently preferred embodiment utilizing a plurality of fixed volume containers disposed about the surface of the starting crystal wafer, whereby each container ultimately defines a junction for a separate device upon dicing of the wafer.

Accordingly, it is an object of the present invention to provide an improved technique for creating a fused junction in a body of semiconductor material.

It is also an object of the present invention to provide an improved technique for producing an ohmic contact to a semiconductor body.

It is another object of the present invention to provide an improved apparatus for fabricating fused junction semiconductor devices.

It is yet another object of the present invention to provide an apparatus for producing uniform fused junctions in semiconductor bodies.

It is a further object of the present invention to provide a method and apparatus for forming broad area, planar, fused junctions in semiconductor bodies, the junction depth and base thickness being readily controllable.

The present invention comprises a foil fusion technique in which the smooth, planar surface of a semiconductor body is uniformly urged with a predetermined pressure against a metallic foil containing a suitable active impurity, the resulting sandwich being heated to cause alloying. The fusion is performed in an apparatus wherein the metallic foil is disposed upon a planar heat conductive surface of a material which will not wet with the alloy to be formed. This surface has a plurality of depressions therein, each having a diameter and depth to form a die that will contain the upper portion of a fused junction semiconductor or the contact thereto, as desired. The apparatus is so constructed and arranged that the semiconductor body is urged against the metallic foil with a predetermined pressure during heating until the resulting molten layer fills the fixed volume containers, i.e., the depressions. This assures a predetermined sandwich thickness above the junction resulting in a plurality of uniform, planar junctions which may be separated by slicing between the raised projections. Base thickness control is achieved by varying temperature and alloying time according to the calculable solubility of silicon and aluminum. In the presently preferred embodiment of apparatus suitable for performing the method of the present invention, heat is applied to a heating plate of a material characterized by high heat conductivity. The heating plate is sufficiently large so as to accomodate a plurality of semiconductor bodies thereon to simultaneously produce a plurality of identical junctions in each body. Each of the semiconductor bodies is disposed upon a metallic foil within a support assemblage constructed of a heat conductive material which will not wet with the alloy to be formed upon heating of the sandwich. Mounted above the heating plate by a suitable supporting framework are a plurality of vertically oriented, selectively adjustable, helical springs. The heating plate and the spring-supporting framework are enclosed in a housing adapted for the maintenance of a reducing atmosphere therein.

To prepare the apparatus for operation, a metallic foil is disposed upon the bottom plate. A semiconductor wafer is then disposed upon the metallic foil and the top plate is then placed in position upon the upper surface of the semiconductor body. The resulting assemblage is then placed upon the heating plate directly beneath one of the helical springs and the end of the spring placed in contact with the upper surface of the top plate, the spring-supporting framework then being adjusted to compress the spring with a predetermined force. A desired atmosphere is then created within the housing and the heating plate or furnace is heated to a predetermined temperature sufficient to cause alloying of the metallic foil with the semiconductor material. Upon occurence of alloying, the pressures of the spring will compress the semiconductor body toward the bottom plate of the support structure. The compression of the sandwich results in a constant, uniform layer of molten alloy beneath the lower surface of the semiconductor body filling the depressions in the bottom plate with excess alloy being squeezed out from the space between the semiconductor body and the bottom plate. The use of a metallic foil of uniform thickness allows consistent involvement of the semiconductor material and the use of the fixed volume depressions in the bottom plate furnishes a predetermined unvarying amount of molten material in the form of a liquidus alloy from which to regrow. The combination of these two features results in maintenance of a uniform sandwich thickness during alloying and enables the repetitive production of substantially identical planar junctions, thereby resulting in a method and apparatus suitable for application in mass production techniques.

The novel features which are believed to be characteristic of the invention, both as to its organization and method of operation, together with further object and advantages thereof will be better understood from the following description considered in connection with the accompanying drawing, in which a presently preferred embodiment of the invention is illustrated by way of example. It is to be expressly understood, however, that the drawing is for the purpose of illustration and description only, and is not intended as a definition of the limits of the invention.

Figure 1:
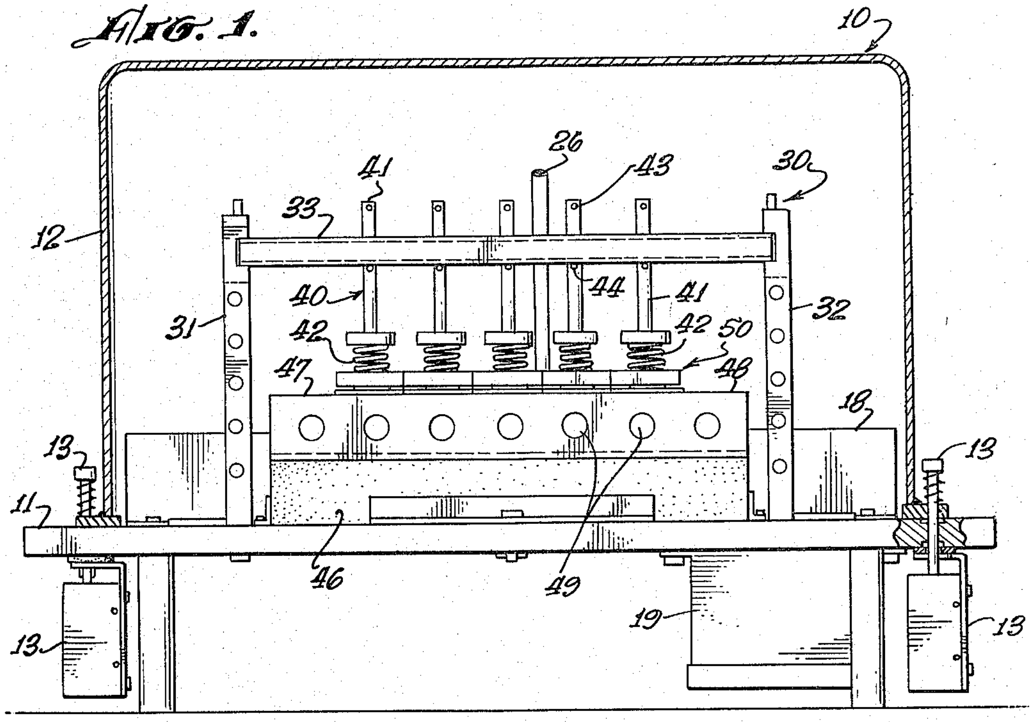
FIGURE 1 is a side view, partly in section, of apparatus suitable for performance of the method of the present invention.
Figures 2, 4:
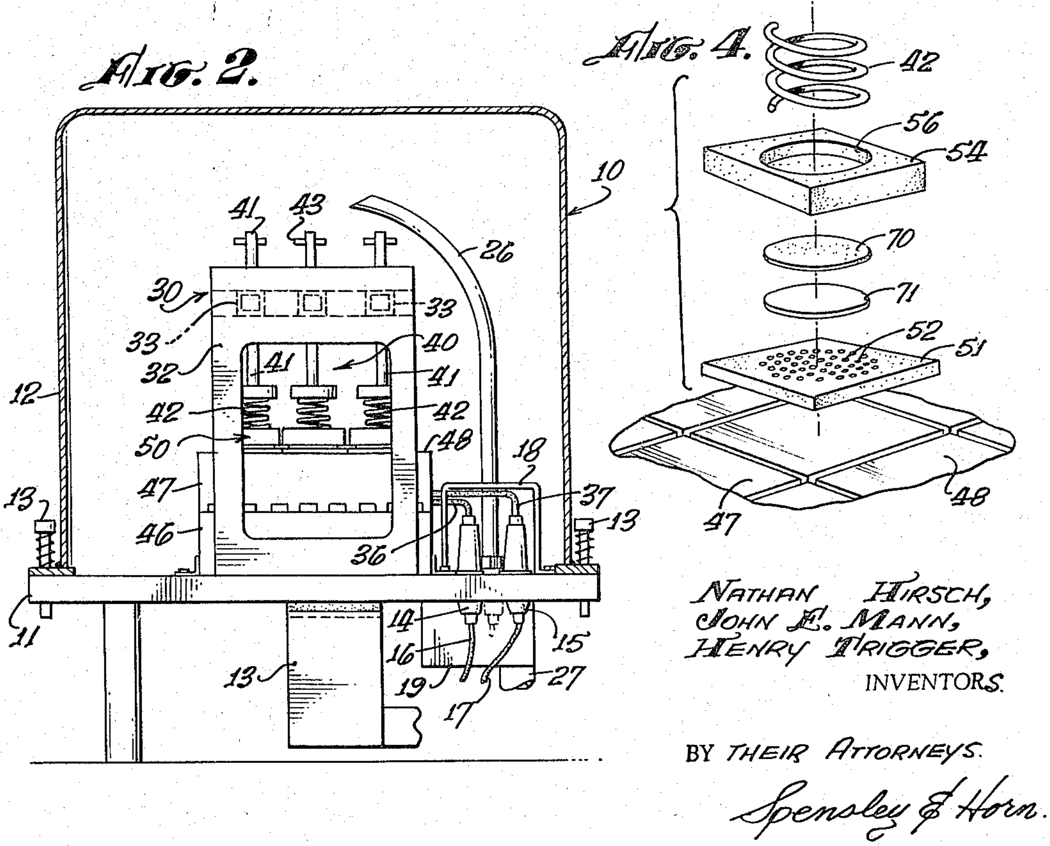
FIGURE 2 is an end view, partly in section, of the apparatus of FIGURE 1.
FIGURE 4 is an exploded view showing a support structure used for mounting semiconductor bodies in the apparatus of FIGURES 1 and 2.
Figure 3:
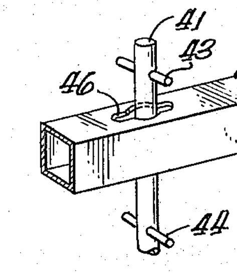
FIGURE 3 is a perspective view showing a portion of the supporting framework of the apparatus of FIGURES 1 and 2.

Turning now to the drawing, in FIGURES 1 and 2, there are shown views of an apparatus suitable for the performance of the method of the present invention. The apparatus consists of a housing generally indicated by the reference numeral 10, a supporting framework generally indicated by the reference numeral 30 and a semiconductor support structure generally indicated by the reference numeral 50. The housing 10 consists of a table 11 and a cover 12 detachably mounted thereto by fasteners 13. Extending through the upper surface of the table 11, and sealed thereto, are a pair of feed-through insulators 14 and 15, as can best be seen in FIGURE 2. Connected to the lower terminals of the feed-through insulators 14 and 15 are electrical leads 16 and 17, respectively. The electrical leads 16 and 17 are connected to a source of electrical current, not shown. The upper terminals of the feed-through insulators 14 and 15 are connected to an electrical heater within the housing 10, in a manner to be explained hereinbelow. Mounted to the upper surface of the table 11, as shown, is a shield cover 18 to protect the upper terminals of the feed-through insulators 14 and 15. A shield cover 19 is mounted to the underside of the table 11, as shown, to protect the lowermost terminals of the feed-through insulators 14 and 15. Projecting through the surface of the table 11, and sealably mounted thereto, is an inlet pipe 26 and an outlet pipe 27. The inlet pipe 26 and the outlet pipe 27 are coupled to a suitable pumping system, not shown, to enable creation of a desired atmosphere within the housing. The supporting framework 30 is mounted to the upper surface of the table 11 within the housing 10. The supporting framework 30 consists of a pair of mounting posts 31 and 32, a series of crossbars 33 supported in horizontal alignment by the mounting posts 31 and 32, and a series of plunger assemblies, indicated generally by the reference numeral 40, mounted to each of the crossbars 33. Each of the plunger assemblies 40 consists of an elongate plunger rod 41, a helical spring 42 axially mounted to one end of the plunger rod 41, and spaced apart stop bars 43 and 44 mounted transversely to the plunger rod 41 near the other end thereof. As can best be seen from FIGURE 3, the plunger rods 41 are vertically mounted through an irregularly shaped hole 46 in the crossbars 33, the irregularly shaped hole 46 having a circular central portion and elongate diametrically opposite projecting portions to clear the stop bars 43 and 44. By rotation of the plunger rods 41 to the position shown in FIGURE 3 with the stop bars 43 and 44 in perpendicular alignment to the elongate projections on the irregularly shaped hole 46 and the crossbars 33, it is seen that the plunger rods 41 will be slidably retained on the crossbars 33.

Mounted on the upper surface of the table 11, between the mounting posts 31 and 32 and beneath the crossbars 33 is a block 46 of refractory material. Disposed atop the refractory block 46 is an electrical heating plate 47 having a planar upper surface 48. The electrical heating plate 47 provides an even distribution of heat across its upper surface 48. Such types of heaters are well known in the art and hence will not be discussed in detail. An example of such a heater is a block of highly heat conductive material having a plurality of electrical cartridges disposed in apertures therein or having a resistance wire heating element disposed along a sinuous passageway or groove therein. In the illustrated embodiment, a plurality of cartridge type heaters 49, are utilized. Electrical connection to the cartridge heaters 49 is provided by the electrical leads 36 and 37 connected to the feed-through insulators 14 and 15, respectively. The upper surface 48 of the electrical heating plate 47 may be scored with indicating marks to facilitate alignment of the support structures 50 directly beneath the plunger assemblies 40. In the illustrated embodiment, a rectangular grid pattern is scored upon the upper surface 48 of the heating plate 47, as indicated in FIGURE 4. It is apparent that the electrical heating plate 47 must be constructed of a material having a melting point significantly higher than the temperature at which the alloying process is to be performed. For example, if it is desired to create a PN junction in a silicon semiconductor crystal of N type conductivity by using an aluminum metallic foil, the electrical heating plate 47 may be constructed of copper.

Each of the support structures 50 is constructed of a heat conductive material which will not wet with the alloy to be formed of the semiconductor and metallic foil materials utilized to form the fused junction in the semiconductor body at the temperature required for fusion. As can be seen from FIGURE 4, the support structures of the illustrated embodiment are for use with a disc-shaped semiconductor wafer 70. Each of the support structures 50, consists of a rectangular bottom plate 51, having depressions 52 therein, and a rectangular top plate 54 having a central circular recess 56 therein. The lateral dimensions of the bottom plate 51 substantially correspond to but are slightly smaller than the dimensions of the rectangular grid scored upon the upper surface 48 of the electrical heating plate 47 to permit accurate alignment of the support structures 50 beneath a plunger assembly 40 without having adjoining plates 51 touching. The lateral dimensions of the top plate 54 are slightly smaller than the lateral dimensions of the bottom plate 51 to provide spacing between top pltaes 54 of the adjacent support structures to avoid undesirable lateral heating effects therebetween. The exterior shapes of the various elements of the support structures are otherwise uncritical. Each of the support structures 50 must be identical when utilizing an identical series of semiconductor wafers and metallic foil.

In the illustrated embodiment, it is desired to produce a plurality of uniform, planar PN junctions within a silicon crystal wafer of N type conductivity utilizing an aluminum foil as the source of acceptor impurity. The disc-shaped semiconductor wafer 70 is a silicon crystal wafer of N type conductivity having a thickness of 5½ mils and a diameter of ⅞ inch. The metallic foil disc 71 is cut from an aluminum foil sheet of 5 mils thickness, the diameter of the disc 71 also being ⅞ inch. The thicknesses may be varied to provide desired junction characteristics. The diameter of the apertures 52 and their depth determine the size of the semiconductor and the depth of the contact surface. Typical examples are 5 to 10 mils diameters and .2 to 1 mil depths, although these sizes may vary. In one embodiment the apertures have a 25 mil center to center spacing whereas another has a 50 mil spacing. The bottom plates 51, and the top plates 54 comprising the support structures 50 are fabricated of graphite, a heat conductive material which will withstand the operating temperatures encountered in the fusion of aluminum and silicon and which will not wet with aluminum-silicon alloys.

Figure 5:
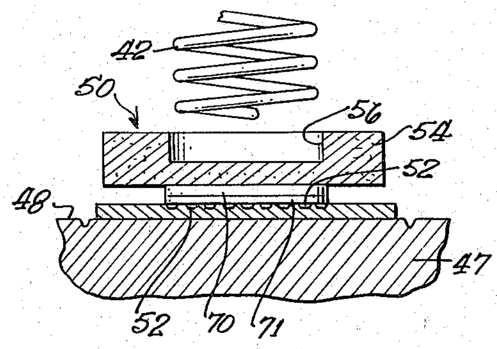
FIGURE 5 is a sectional view, in elevation, of the support structures of FIGURE 4 during one step of the present invention.
Figure 6:
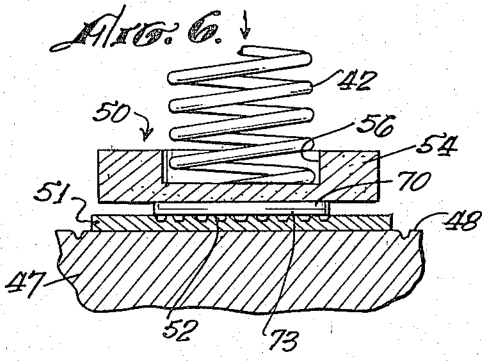
FIGURE 6 is a sectional view, in elevation, showing the support structure of FIGURE 4 in a subsequent step of the present invention.

To prepare the apparatus of the present invention for use, the cover 12 is removed from the table 11 and the plunger rods 41 of the plunger assemblies 40 are elevated to an upper position by upward movement of the plunger rod 41 while the stop bars 43 and 44 are in alignment with the projecting portions of the apertures 46 and the crossbars 33. When the lower crossbar 44 passes through the aperture 46, the plunger rod 41 is rotated through approximately 90° and the plunger rod lowered until the rod is supported in an upper position by the contact between the stop bar 44 and the crossbar 33. Next, a support structure 50 is assembled beneath each plunger assembly 40 and an aluminum foil disc 71 is disposed upon the upper surface of the bottom plate 51. An N type silicon semiconductor wafer 70 is then disposed on the top of the metallic foil disc 71 and the top plate 54 is then positioned on the upper surface of the semiconductor wafer 70. The resulting assemblage is positioned directly beneath the lower end of the helical spring 42 of the plunger assembly 40, the resulting assemblage being shown in FIGURE 5. Since the plunger assembly 40 is supported in an uppermost position, the bottom of the helical spring 42 will not contact the upper plate 54 and the support structure assemblages may be easily moved about the surface 48 of the electrical heating plate 47.

Figure 7:
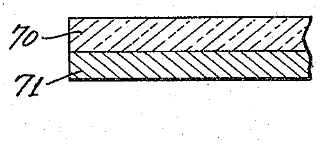
FIGURE 7 is an elevational view showing the relative thicknesses of the semiconductor body-metallic foil sandwich mounted in the support structure at the production stage illustrated by FIGURE 5.

Upon alignment of a support structure 50, containing a semiconductor wafer 70 and the metallic foil disc 71 beneath the plunger assembly 40, that plunger assembly 40 is lowered by rotation of the plunger rod 41 until the stop bars 43 and 44 are again in alignment with the projection on the apertures 46 and the crossbars 33. The plunger assembly 40 is then urged downward until the lower end of the helical spring 42 seats within the recess 56 in the upper plate 54 of the support structure 50, and the plunger rod 41 is urged downward stilll further to cause compression of the spring 42, the helical spring 42 providing a compressive force of about 7 pounds. The plunger assembly 40 is then locked in a lower position by the downward passage of the lower stop bar 44 through the aperture 46 and a subsequent rotation of the plunger rod 41 to a position wherein the upper surface of the lower stop bar 44 is in contact with the lower surface of the crossbar 33 (see Figure 1). In this lowermost position, the helical spring 42 is compresssed, thereby urging the semiconductor wafer 70 against the metal foil disc 71. The resulting sandwich structure being shown in Figure 7. The cover 12 is then installed and sealed to the upper surface of the table 11 by fasteners 13. Since silicon surfaces are subject to rapid oxidation, it is desired to carry out the fusion process in a reducing or non-oxidizing atmosphere. Hence, a nitrogen atmosphere is then created within the housing 10 by actuation of a suitable pumping system coupled to the pipes 26 and 27, the nitrogen atmosphere being pumped into the housing 10 through the inlet pipe 26 and exhausted through the outlet pipe 27. The nitrogen pressure is not critical, a pressure of just over 1 p.s.i. being presently preferred. The electrical cartridge heaters 49 are energized by connection to a suitable source of electricity through the electrical leads 16 and 17 and the heaters elevated to a temperature of about 725° C. by control of the electrical current. Upon softening of the metallic foil 71 during the alloying process, the downward force exerted by the compressed spring 42 will force the top plate 54 downward until it nearly rests upon the upper surface of the bottom plate 51, thereby squeezing out most of the excess liquidus alloy 73 after the depressions 52 become filled. An aluminum layer of approximately .1 mil thickness extends between the wafer 70 and the graphite plate 51 to provide an overall thickness of the semiconductor of about 6 mils final thickness. An alloying time of about 3 minutes having been found sufficient at process temperatures near 725° C.

Since the top plate 54 moves downward until it nearly seats upon the upper surface of the bottom plate 51, it maintains a constant, controlled thickness of silicon-saturated molten aluminum within the depression 52 beneath the lower surface of the semiconductor wafer 70 during alloying, the negligible weight of the semiconductor wafer 70 causing no significant compressive effect. This careful control of the amount of molten alloy from which to regrow results not only in a uniform, planar junction but also in junction reproducibility. As mentioned hereinabove, junction characteristics depend in a known manner upon the amount of liquidus alloy from which regrowing occurs, hence predetermined junction characteristics can be achieved. Controlled base thickness is achieved by calculation of the solubility of the silicon-aluminum based upon the selected temperatures and alloying times.

Upon completion of the alloying process, the electrical leads 16 and 17 are disconnected from the source of electrical current. At this point, maintenance of a reducing atmosphere within the housing 10 is no longer necesssary and, upon cooling, the cover 12 is removed and the plunger assemblies 40 raised to the aforementioned upper position to allow removal of the support structures 50 from the apparatus.

Figure 8:
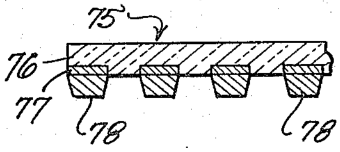
FIGURE 8 is an elevational view illustrating the resulting fused junction structure formed in accordance with the present invention method and apparatus.

During cooling crystal regrowth occurs from the silicon saturated liquidus alloy; the resulting diode structure being indicated in Figure 8 by the reference numeral 75. The structure comprises an uppermost layer 76 of N type silicon (the remaining undissolved portion of the starting wafer 70), an intermediate layer 77 of P type silicon with some atoms of aluminum dispersed therethrough (resulting from silicon regrowth from the liquidus alloy 73), and a lowermost layer 78 of aluminum with some silicon atoms dispersed therethrough. The intermediate region 77 defines the fused PN junction and although definite boundaries between the regions 76, 77 and 78 do not exist, they are indicated on the drawing in a general manner for purpose of illustration.

Figure 9:
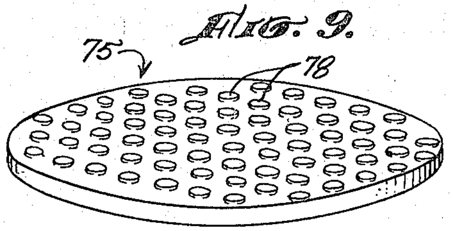
FIGURE 9 is a perspective view of the resulting structure inverted and ready for slicing.

Upon removal of the diode wafers 75 from the support structures 50, each wafer appears as shown in Figure 9, with a plurality of aluminum projections 78 on the silicon disc 76. Each projection is the location of an individual semiconductor which can be individually checked for its characteristics before removal and mounting. These wafers, having a desired uniformity within an acceptable tolerance range, may then be diced between the projections into a plurality of small diodes in accordance with standard techniques in the art. Each diode will then have an identical, uniform, fused PN junction of predetermined characteristics.

Thus, there has been hereinabove described a foil fusion technique for producing uniform, planar fused junctions in bodies of semiconductor material. Performance of the technique with the disclosed apparatus results in the repetitive production of substantially identical junctions of uniform thickness for identical semiconductor bodies and foil sheets. Due to the creation of uniform junctions and the reproducibility of the process utilizing the described apparatus, it is apparent that the present invention is particularly suited for the mass production of semiconductor devices. Substantially identical, uniform junctions can be simultaneously produced in a plurality of semiconductor wafers, each of the wafers then being diced to form a plurality of semiconductor bodies having identical junctions therein.

Figure 10:
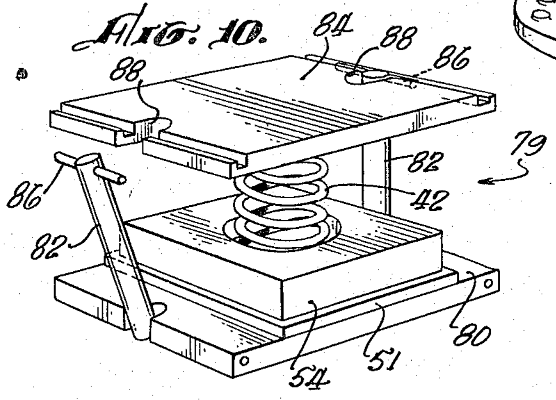
FIGURE 10 is a perspective view of another form of support structure for retaining semiconductor bodies in position for fusing.

Reference is now made to the jig 79 shown in Figure 10 which is adapted to be placed into any desired type of furnace and within a desired atmosphere of oxygen, hydrogen, nitrogen, etc. Here the graphite bottom plate 51 is mounted on a base plate 80 to which connectors 82 are pivotally mounted at each end. After the top plate 54 is placed over the silicon-aluminum sandwich and spring 42 is placed in position, cover plate 84 is urged downwardly until the stop bars 86 on connector 82 extends above plate 84 when connector 82 is pivoted into notch 88 at the end of plate 84. With plate 84 locked into position by the connectors 82 at both ends, jig 79 may then be placed in any desired environment and subjected to heat from any type of heat source.

Although the invention has been described with a certain degree of particularity, it is understood that the present disclosure had been made only by way of example and that numerous changes in the details of construction and the combination and arrangement of parts may be resorted to without departing from the spirit and the scope of the invention as hereinafter claimed. Although specific semiconductor and metallic materials were specified in the illustrated example to form a PN junction, it is apparent that other suitable materials can be selected to form either rectifying or non-rectifying junctions. For example, gold foil may be fused to silicon to provide an ohmic contact to a semiconductor body. The gold foil may be doped with an active impurity of the same conductivity type as the semiconductor surface, if desired, to produce an extremely low resistance non-rectifying junction. The fusion temperature would be on the order of 370° C. (the silicon-gold eutectic temperature) and would permit the use of an electrical heating plate constructed of aluminum. Furthermore, although the foil in the illustrated example was itself the active impurity, it is within the purview of the present invention to utilize a foil substance, not necessarily metallic, doped with the active impurity atoms. The active impurity atoms may be of one type or may be a combination of different types of active impurity elements.

What is claimed is:

1. In apparatus for producing fused junctions in a body of semiconductor material having a surface, the combination of:
(a) a supporting structure;
(b) a heating plate having an upper planar surface, said heating plate being mounted to said supporting structure and including means for heating said plate;
(c) a bottom plate for disposition on said heating plate, said bottom plate having an upper planar surface with a plurality of evenly spaced depressions therein, said bottom plate being formed of a material nonwetable by the material of the semiconductor;
(d) a top plate mounted upon the supporting structure above the bottom plate and having a planar lower surface; and,
(e) means for resiliently urging said top plate toward said bottom plate.

2. In apparatus for producing fused junctions in a body of semiconductor material having a planar surface, the combination of:
(a) a housing adapted for the maintenance therein of a predetermined atmosphere;
(b) a supporting structure disposed within said housing;
(c) a heating plate having an upper planar surface, said heating plate being mounted to said supporting structure and including means for heating said plate;
(d) a bottom plate for disposition on said heating plate, said bottom plate having an upper planar surface with a plurality of evenly spaced depressions therein, said bottom plate being formed of a material non-wetable by the material of the semiconductor;
(e) a top plate mounted upon the supporting structure above the bottom plate and having a planar lower surface; and
(f) means for resiliently urging said top plate toward said bottom plate.

References Cited by the Examiner

UNITED STATES PATENTS

| | | | |
|---|---|---|---|
| 3,070,859 | 1/1963 | Hamilton | 22—58 |
| 3,127,646 | 4/1964 | Hamilton | 249—83 |
| 3,188,252 | 6/1965 | Trigger et al. | 148—184 |

FOREIGN PATENTS

| | | |
|---|---|---|
| 71,141 | 6/1952 | Netherlands. |

J. SPENCER OVERHOLSER, *Primary Examiner.*

MARCUS U. LYONS, *Examiner.*